United States Patent
Yue et al.

(10) Patent No.: US 10,212,867 B2
(45) Date of Patent: Feb. 19, 2019

(54) TRANSFER APPARATUS AND TRANSFER METHOD

(71) Applicant: BOE TECHNOLOGY GROUP CO., LTD., Beijing (CN)

(72) Inventors: Han Yue, Beijing (CN); Dongni Liu, Beijing (CN); Xiaochuan Chen, Beijing (CN); Shengji Yang, Beijing (CN); Lei Wang, Beijing (CN); Jie Fu, Beijing (CN); Pengcheng Lu, Beijing (CN); Li Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/686,360

(22) Filed: Aug. 25, 2017

(65) Prior Publication Data
US 2018/0197767 A1  Jul. 12, 2018

(30) Foreign Application Priority Data
Jan. 9, 2017  (CN) .......................... 2017 1 0015064

(51) Int. Cl.
*H01K 13/04* (2006.01)
*H05K 13/04* (2006.01)
(Continued)

(52) U.S. Cl.
CPC ............ *H05K 13/0404* (2013.01); *B25J 7/00* (2013.01); *B25J 15/0014* (2013.01); *B25J 15/0028* (2013.01); *B25J 15/0052* (2013.01); *B25J 15/0206* (2013.01); *B25J 15/10* (2013.01); *B25J 15/12* (2013.01); *B65G 47/907* (2013.01);
(Continued)

(58) Field of Classification Search
CPC ............ H01L 21/68707; H01L 21/687; H01L 21/68728; B25J 15/0028; B65G 61/00; H05K 13/04–13/0404
See application file for complete search history.

(56) References Cited

U.S. PATENT DOCUMENTS 7,461,882 B2    12/2008  Choi et al.
2001/0042305 A1*  11/2001  Martin ............... H05K 13/0404
29/834
(Continued)

FOREIGN PATENT DOCUMENTS

CN      104661953 A    5/2015
JP      2004082239 A   3/2004
(Continued)

OTHER PUBLICATIONS

First Chinese Office Action dated Oct. 31, 2018.

*Primary Examiner* — Selim U Ahmed
*Assistant Examiner* — Evan G Clinton
(74) *Attorney, Agent, or Firm* — Dilworth & Baresse, LLP; Michael J. Musella, Esq.

(57) ABSTRACT

A transfer apparatus and a transfer method are provided. The transfer apparatus includes a transfer substrate; and a plurality of gripping members arranged in an array and disposed on the transfer substrate. Each gripping member includes at least two gripping arms each of which has a first end disposed on the transfer substrate, and gripping legs connected with second ends of the gripping arms and configured to switch between a gripping position and a released position.

17 Claims, 4 Drawing Sheets

(51) Int. Cl.
  *H01L 21/687* (2006.01)
  *B25J 15/00* (2006.01)
  *B65G 61/00* (2006.01)
  *B25J 7/00* (2006.01)
  *B25J 15/02* (2006.01)
  *B25J 15/10* (2006.01)
  *B25J 15/12* (2006.01)
  *B65G 47/90* (2006.01)

(52) U.S. Cl.
  CPC ............ *B65G 61/00* (2013.01); *H01L 21/687* (2013.01); *H01L 21/68707* (2013.01); *H01L 21/68728* (2013.01)

(56) References Cited

U.S. PATENT DOCUMENTS

| | | |
|---|---|---|
| 2014/0084240 A1 | 3/2014 | Hu et al. |
| 2015/0021466 A1 | 1/2015 | Bibl et al. |
| 2017/0142874 A1* | 5/2017 | Pourchet ............. H01L 21/6836 |

FOREIGN PATENT DOCUMENTS

| | | | |
|---|---|---|---|
| JP | WO 2017125996 A1 * | 7/2017 | ............. H05K 13/04 |
| JP | WO 2017208964 A1 * | 12/2017 | ............. B25J 15/08 |
| WO | 2014029417 A1 | 2/2014 | |

* cited by examiner

TRANSFER APPARATUS AND TRANSFER METHOD

The application claims priority to the Chinese patent application No. 201710015064.2, filed Jan. 9, 2017, the disclosure of which is incorporated herein by reference as part of the application.

TECHNICAL FIELD

At least one embodiment of the present invention relates to a transfer apparatus and a transfer method.

BACKGROUND

Currently, many semiconductor elements such as micro-light-emitting diodes (LEDs) and micro-lasers are made from single-crystal semiconductor materials. The growth of the single-crystal semiconductor materials has strict requirement on substrates. The grown single-crystal semiconductor materials must be matched with substrate lattices, or else, the properties of the semiconductor materials will be affected. Therefore, the semiconductor elements have strong selectivity on the substrate. The substrate is usually small. Moreover, due to the influence of materials and subsequent processes, a driver IC is not applicable, so the integration of the semiconductor elements can be severely affected.

SUMMARY

At least one embodiment of the disclosure provides a transfer apparatus includes a transfer substrate; and a plurality of gripping members arranged in an array and disposed on the transfer substrate. Each gripping member includes at least two gripping arms each of which has a first end disposed on the transfer substrate, and gripping legs connected with second ends of the gripping arms and configured to switch between a gripping position and a released position.

At least one embodiment of the disclosure provides a transfer method for employing the transfer apparatus as mentioned above, comprising: disposing a side of the transfer apparatus, provided with the plurality of gripping members arranged in an array, to face a side of an original substrate provided with a plurality of target elements, so that projections of the plurality of target elements on the transfer substrate fall within projections of the plurality of gripping members on the transfer substrate; moving the transfer apparatus in a direction towards the original substrate; moving the gripping legs to the gripping position so as to grip the target elements; aligning the transfer substrate and a receiving substrate; and moving the gripping legs to the released position from the gripping position, so as to release the target elements onto the receiving substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
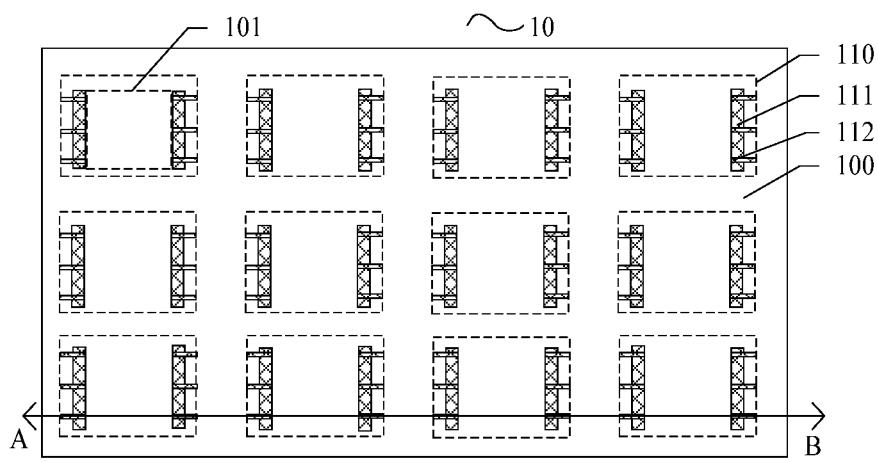
FIG. 1A is a schematic plan view of a transfer apparatus provided by one embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

The embodiment of the present invention provides a transfer apparatus, which comprises a transfer substrate and a plurality of gripping members arranged in an array. The plurality of gripping members is disposed on the transfer substrate. Moreover, each gripping member includes: at least two gripping arms, in which a first end of each gripping arm is disposed on the transfer substrate; and gripping legs, in which the gripping legs connected with second ends of the gripping arms and configured to switch between a gripping position and a released position. The transfer apparatus provided by the embodiment of the present invention has strong gripping ability on target elements, has small damage to the target elements, and can also realize the transferring of all or a part of the target elements.

The embodiment of the present invention provides a transfer method, which employs the transfer method and comprises: disposing a side of the transfer apparatus, provided with the plurality of gripping members arranged in an array, to face a side of an original substrate provided with a plurality of target elements, so that projections of the plurality of target elements on the transfer substrate fall within projections of the plurality of gripping members on the transfer substrate; moving the transfer apparatus in a direction towards the original substrate; moving the gripping legs to the gripping position so as to grip the target elements; aligning the transfer substrate and a receiving substrate; and moving the gripping legs to the released position from the gripping position, so as to release the target elements onto the receiving substrate. The transfer method provided by the embodiment of the present invention can realize the transfer printing of all or a part of the target elements, and has small damage to the target elements during transfer printing.

Description will be given below to the transfer apparatus and the transfer method, provided by the embodiment of the present invention, with reference to the accompanying drawings.

First Embodiment

The embodiment provides a transfer apparatus. FIG. 1A is a schematic plan view of the transfer apparatus 10. As illustrated in FIG. 1A, the transfer apparatus 10 comprises a transfer substrate 100 and a plurality of gripping members 110 arranged in an array. The plurality of gripping members 110 is disposed on the transfer substrate 100. The gripping member 110 is configured to grip a target element to be gripped. Each gripping member 110 includes: at least two gripping arms 111, in which a first end of the gripping arm 111 is disposed on the transfer substrate 100; and gripping leg 112, in which the gripping leg 112 is connected with a second end of the gripping arm 111 and configured to switch between a gripping position and a released position. The gripping leg 112 in FIG. 1A is in the initial state, which is also the state of the released position. In addition, the initial state of the gripping leg may also be the state of the gripping position. No limitation will be given here in the embodiment. The transfer apparatus provided by the embodiment has strong gripping ability on the target elements, has small damage to the target elements, and can also realize the transfer printing of all or a part of the target elements.

For example, the gripping arm 111 is extended along the direction away from the transfer substrate 100, and the gripping leg 112 is extended along the direction perpendicular to the griping arm 111. The "perpendicular" here includes "strictly perpendicular" and "roughly perpendicular". For example, the gripping arm 111 may be extended along the direction perpendicular to the transfer substrate 100 and may also be extended along the direction away from the transfer substrate 100, at a certain angle with the transfer substrate 100, which is not limited in the embodiment and may be set according to actual demands. For example, the length of the gripping arm 111 of each gripping member 110 is not less than the thickness of the target element to be gripped.

For example, as illustrated in FIG. 1A, the gripping leg 112 may be configured to move to the gripping position or the released position relative to the gripping arm 111 in a plane parallel to the transfer substrate 100, namely the gripping leg 112 moves relative to the gripping arm 111 along the AB direction. The embodiment is not limited thereto. For example, the gripping leg 112 may also be configured to allow one end to be connected with the second end of the gripping arm 111, and allow the other end to rotate to the gripping position or the released position in the plane parallel to the transfer substrate 100.

Figure 1B:
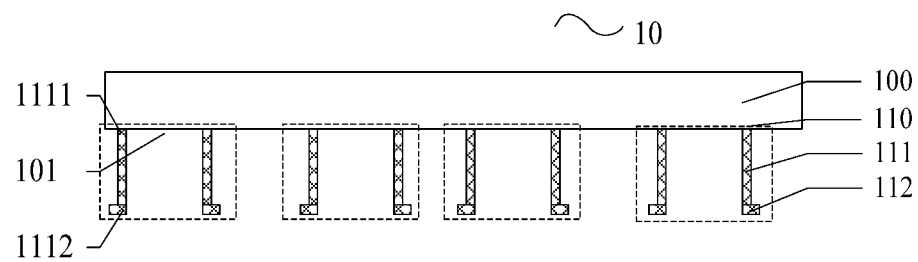
FIG. 1B is a schematic sectional view of the transfer apparatus as illustrated in FIG. 1A along the AB direction.

FIG. 1B is a schematic sectional view of the transfer apparatus 10 as illustrated in FIG. 1A along the AB direction. As illustrated in FIG. 1B, the transfer substrate 100 includes a plurality of gripping areas 101 arranged in an array; and one gripping member 110 is disposed on each gripping area 101, namely the plurality of gripping areas 101 are in one-to-one correspondence with the plurality of griping members 110. For example, each gripping member 110 adopts two gripping arms 111 to grip a target element (as illustrated in FIG. 1A); the two gripping arms 111 are respectively disposed at two opposite edges of the gripping area 101; and a second end 1112 of each gripping arm 111 may be provided with a plurality of gripping leg 112 or one gripping leg 112 which is configured to grip the target element. It should be noted that the space between the gripping arms 111 may accommodate the target element to be gripped, so that the gripping member 110 can grip the target element to be gripped. The embodiment is not limited thereto. For example, a plurality of gripping arms 111 may be respectively disposed at two opposite edges of the gripping area 101, and a second end 1112 of each gripping arm 111 is connected with one gripping leg 112.

Figure 1C:
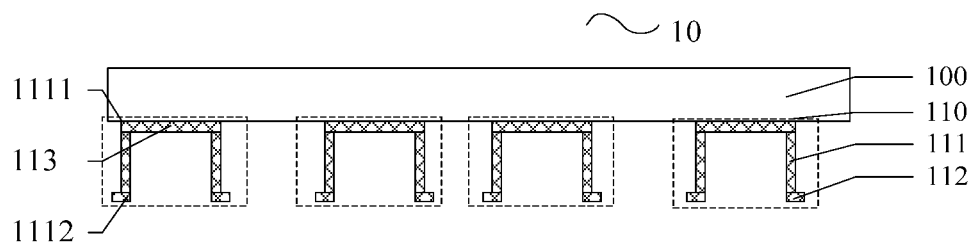
FIG. 1C is a schematic sectional view of a transfer apparatus provided by another example of one embodiment of the present invention.

FIG. 1C is a schematic sectional view of a transfer apparatus 10 provided by another example of the embodiment. As illustrated in FIG. 1C, the gripping member 110 also includes a base 113 which is disposed on the transfer substrate 100, and the first end 1111 of the gripping arm 111 is disposed at the edge of the base 113. For example, the plurality of gripping areas 101 fall within projections of the plurality of bases 113 on the transfer substrate 100. It should be noted that the space between the gripping arms can accommodate the target element to be gripped, so that the gripping member 110 can grip the target element to be gripped.

Figure 1D:
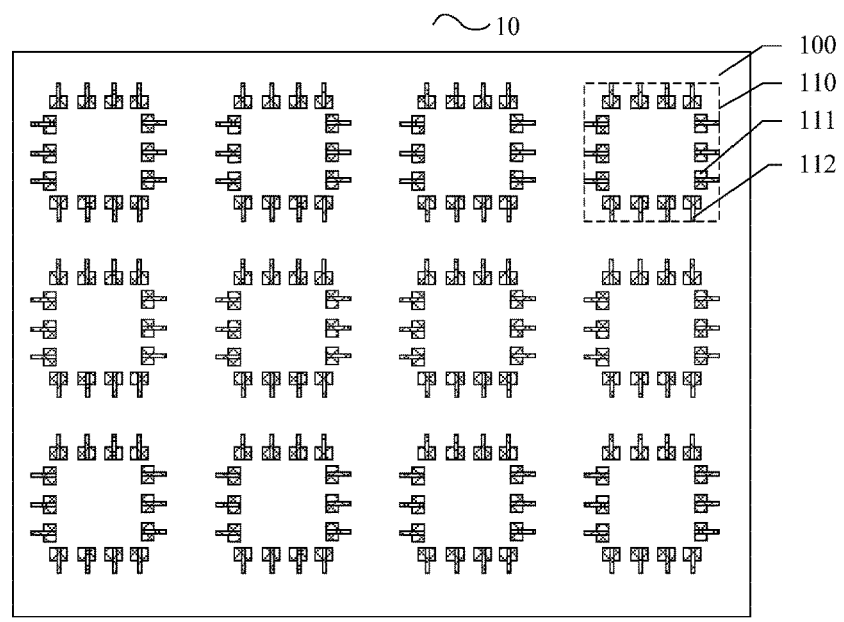
FIG. 1D is a schematic plan view of the transfer apparatus provided by another example of one embodiment of the present invention.

FIG. 1D is a schematic plan view of a transfer apparatus 10 provided by another example of the embodiment. As illustrated in FIG. 1D, the gripping arms 111 may be disposed at four edges of each gripping area 101; and a second end of each gripping arm 111 is connected with one gripping leg 112. No limitation will be given here in the embodiment. For example, any edge of each gripping area 101 may be provided with one gripping arm 111 and may also be provided with a plurality of gripping arms 111, which is not limited in the embodiment. For example, when any edge of each gripping area 101 is provided with one gripping arm 111, a second end of each gripping arm 111 may be connected with one gripping leg 112 and may also be connected with a plurality of gripping legs 112, which is not limited in the embodiment.

For example, the distance between the plurality of gripping members 110 is determined by the distance between the plurality of target elements to be gripped. It should be noted that the target elements in the embodiment are semiconductor elements such as micro-LEDs and micro-lasers. The "micro" here refers to the scale of 1-100 μm. But no limitation is given here in the embodiment of the present invention. Larger or smaller size scale may also be applicable according to specific conditions.

For example, the maximum size of each gripping area 101 is 1-100 μm, namely the maximum size of a projection of each of the plurality of gripping members of the transfer apparatus on the transfer substrate is about 1-100 µm. It should be noted that the gripping member in the transfer apparatus provided by the embodiment is a micro electro mechanical system (MEMS) member and is an integrated member for integrating a micromechanical structure and a microelectronic circuit on the same substrate. In the embodiment, microstructures, for example, including the plurality of gripping arms in the gripping members, for example, also including the bases, may be formed on the transfer substrate by wet etching and/or dry etching in combination with mask etching.

For example, the transfer apparatus further comprises a control system which is configured to apply a first control signal or a second control signal to each gripping member. The control system is not illustrated in the embodiment. For example, the applied control signals include control signals respectively applied to the gripping arms and the gripping legs, so that the gripping legs can move to the gripping position or the released position relative to the gripping arm. The embodiment is not limited thereto. For example, the applied control signal is the first control signal or the second control signal applied to the gripping legs, so that the other end of the gripping legs can rotate to the gripping position or the released position in a plane parallel to the transfer substrate when one end of the gripping leg is connected with the second end of the gripping arm. For example, the control system may simultaneously apply the control signals to all the gripping members, so as to realize the transferring of all the target elements; and the control system may also respectively apply the control signal to each gripping member, namely may selectively control partial gripping members, so as to realize the transfer printing of partial target elements.

For example, the control system applies the first control signal to the gripping member in the released position. For example, voltage with opposite polarities is respectively applied to the gripping arm and the gripping leg, so that the gripping arm and the gripping leg can respectively carry charges with opposite polarities, and hence produce electrostatic forces attracting each other. Due to the produced electrostatic force, after the gripping leg of each gripping member move to the gripping position, projections of the gripping leg are at least partially disposed in the gripping area corresponding to the gripping member, namely the gripping leg move in the direction towards the target element until the gripping leg are at least partially disposed at the bottom side of the target element, so as to grip the target element.

For example, the control system applies the second control signal to the gripping member in the gripping position. For example, voltage with same polarity is respectively applied to the gripping arm and the griping leg, so that the gripping arm and the gripping leg can respectively carry charges with the same polarity, and hence produce electrostatic forces repelling each other. Due to the produced electrostatic force, after the gripping leg of each gripping member move to the released position, the projections of the gripping leg on the transfer substrate are disposed on the outside of the gripping area corresponding to the gripping member, namely the gripping leg move towards the direction away from the target element, so as to release the target element.

It should be noted that: after the control system applies the control signal to the gripping arm, the second end of the gripping arm carries positive or negative charges; and after the control system applies the control signal to the gripping leg, one end of the gripping leg away from the gripping arm carries positive or negative charges when the gripping leg is in the released position. The embodiment is not limited thereto. One end of the gripping leg close to the gripping arm may also carry positive or negative charges when the gripping leg is in the released position.

For example, in one example, a slide rail (not illustrated in the figure of the embodiment) perpendicular to the gripping arm is disposed at the second end of the gripping arm in each gripping member, and a projection of the slide rail on the transfer substrate is disposed on the outside of the gripping area. The gripping leg is disposed on the slide rail and can slide to and fro on the slide rail, so that the gripping leg can switch between the gripping position and the released position. For example, a baffle is disposed at one end of the slide rail away from the gripping arm, so as to prevent the gripping leg from being disengaged from the slide rail when moving towards the released position. The embodiment is not limited thereto. For example, a protrusion (not illustrated in the figure of the embodiment) is formed at a proper position on the gripping leg. For example, the protrusion may be disposed at one end of the gripping leg away from the griping arm when the gripping leg is in the released position, but the embodiment is not limited thereto. When the gripping leg moves towards the gripping position, the protrusion may be clamped at the second end of the gripping arm, so as to prevent the gripping leg from being disengaged from the slide rail when the gripping leg moves towards the gripping position. It should be noted that the target element may be just gripped when the protrusion on the gripping leg is clamped at the second end of the gripping arm. The embodiment is not limited thereto. The gripping arm and the griping leg may also be connected with each other by other means.

As different from the conventional transfer apparatus for implementing transferring by utilization of attractive force, electrostatic force, van der Waals force or the like, in the embodiment, the MEMS members are adopted as the gripping members in the transfer apparatus to perform transfer printing on the target elements. The gripping members have strong gripping ability on the target elements, have small damage to the target elements, and can also realize the transfer printing of all or a part of the target elements.

Figure 2A:
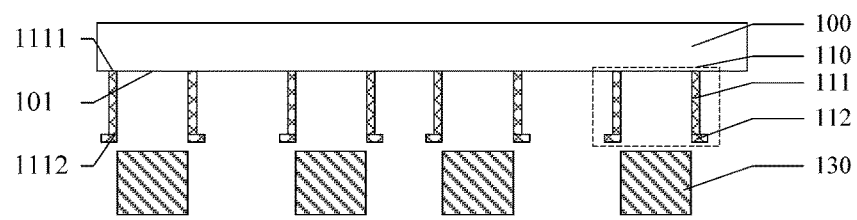
FIG. 2A is a schematic diagram illustrating the case that gripping members in the transfer apparatus provided by one embodiment of the present invention are in the released position.
Figure 2B:
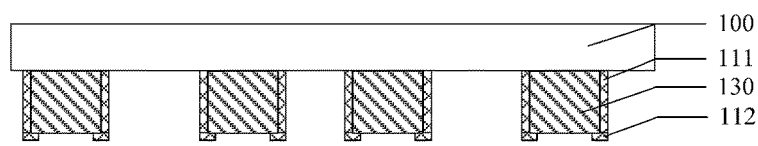
FIG. 2B is a schematic diagram illustrating the case that the gripping members in the transfer apparatus provided by one embodiment of the present invention are in the gripping position.

FIGS. 2A and 2B are schematic diagrams illustrating the case that the gripping members 110 in the transfer apparatus 10 provided by the embodiment are in the released position and the gripping position. As illustrated in FIG. 2A, the gripping legs 112 of the transfer apparatus 10 are in the released position in response to the second control signal applied to the gripping member 110. When the gripping leg 112 in the gripping member 110 are in the released position, the projections of the gripping legs 112 on the transfer substrate 100 are disposed on the outside of the gripping area 101 corresponding to the gripping member 110, and the gripping member 110 may be configured to release the target element 130 onto a receiving substrate.

For example, as illustrated in FIG. 2A, the step of allowing the gripping legs 112 to move to the released positions from the gripping positions includes: the gripping leg 112 of each gripping member 110 move in the direction away from the target element 130 in response to the second control signal applied to the gripping member 110, and release the target element 130 when the projections of the gripping leg 112 on the transfer substrate are disposed on the outside of a projection of the target element 130 on the transfer substrate 100.

As illustrated in FIG. 2B, the step of allowing the gripping leg 112 of the transfer apparatus 10 to move to the gripping positions includes: the gripping leg 112 of each gripping member 110 are configured to move in the direction towards the target element 130 in response to the first control signal applied to the gripping member 110, and grip the target element 130 until the gripping leg 112 at least partially move to positions at the bottom side of the target element 130, at which the target element 130 can be gripped. The embodiment is not limited thereto.

It should be noted that description is given in the embodiment by taking the case that the sectional shape of the target element 130 as illustrated in FIG. 2B is rectangular as an example. At this point, the gripping arm 111 is extended along the direction perpendicular to the transfer substrate 100. The embodiment is not limited thereto. For example, when the sectional shape of the target element is trapezoidal or the like, the gripping arm is set to be extended along the direction away from the transfer substrate, and the space between the gripping arms can accommodate the target element to be gripped, so as to ensure that the gripping member can grip the target element to be gripped.

As illustrated in FIG. 2B, as the space between the gripping arms 111 can just accommodate the target element 130 to be gripped, the transfer apparatus provided by the embodiment has strong gripping ability on the target elements and has small damage to the target elements.

Second Embodiment

The gripping arms in the embodiment are in the flat state in response to the first control signals applied by the control system, and can realize the process of gripping the target elements the same with the first embodiment (namely as illustrated in FIG. 2B). The difference between the embodiment and the first embodiment is that the gripping arms in the gripping member are in the warping state (namely the gripping ember is in the released state) in response to the second control signals applied by the control system, so as to release the target element to be gripped.

Figure 3:
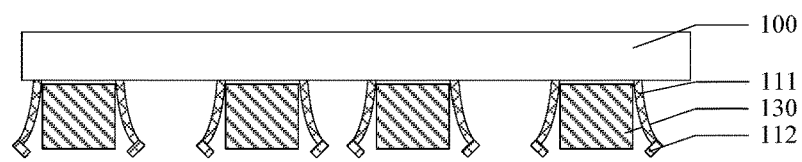
FIG. 3 is a schematic diagram illustrating the case that gripping members in the transfer apparatus provided by another embodiment of the present invention are in the released position.

FIG. 3 is a schematic sectional view when the gripping members in the transfer apparatus provided by the embodiment are in the released position. As illustrated in FIG. 3, after the transfer apparatus moves to a position close to the target element 130, the gripping arms 111 are in the warping state in response to the second control signals applied by the control system. It should be noted that: when the gripping arm is in the flat state, the gripping leg is connected with the second end of the gripping arm and extended along the direction perpendicular to the gripping arm; and when the gripping arm is switched from the flat state to the warping state, the relative position between the gripping leg and the gripping arm (including an included angle between the gripping leg and the gripping arm) does not change, namely the gripping leg is still extended along the direction perpendicular to the gripping arm, as illustrated in FIG. 3.

For example, the gripping arms 111 are in the warping state in response to the second control signals applied by the control system, so that the projections of the gripping leg 112 of each gripping member 110 on the transfer substrate 100 can be disposed on the outside of the gripping area 101 corresponding to the gripping member 110, namely the gripping leg 112 move in the direction away from the target element 130 until the gripping leg are in the released position, so that the gripping member 110 can release the target element 130.

It should be noted that: the application of the second control signal to the gripping member in the embodiment refers to that specific voltage signals are applied to the gripping arms, so that the gripping arms are in the warping state; and the application of the first control signal to the gripping member in the embodiment refers to that no voltage signal is applied to the gripping arms or the applied second control signal is removed, so that the gripping arms are in the flat state.

The transfer apparatus provided by the embodiment has strong gripping ability on the target elements, has small damage to the target elements, and can realize the transferring of all or a part of the target elements.

Third Embodiment

The embodiment provides a transfer method. The transfer method adopts the transfer apparatus 10 as illustrated in FIG. 1A for transfer printing. The transfer apparatus 10 includes a transfer substrate 100 and a plurality of gripping members 110 arranged in an array. The plurality of gripping members 100 is disposed on the transfer substrate 100. The gripping member 110 is configured to grip a target element to be gripped. Each gripping member 110 includes: at least two gripping arms 111, in which a first end of the gripping arm 111 is disposed on the transfer substrate 100; and gripping leg 112, in which the gripping leg 112 is connected with a second end of the gripping arm 111 and configured to switch between a gripping position and a released position.

Figure 4A:
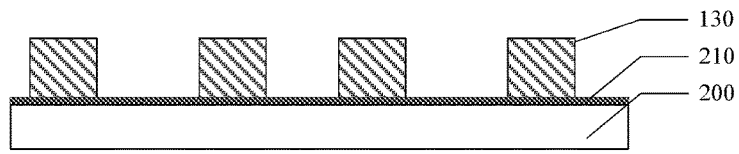
FIGS. 4A-4B are schematic diagrams of target elements formed on an original substrate in one embodiment of the present invention.
Figure 4B:
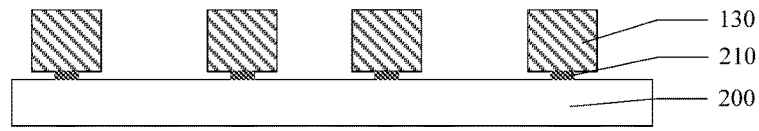

FIGS. 4A-4B are schematic diagrams illustrating the process of forming target elements 130 on an original substrate 200 in the embodiment. As illustrated in FIG. 4A, a sacrifice layer 210 is formed between the original substrate 200 and a plurality of target elements 130, so that the target elements 130 can be separated from the original substrate 200 in the subsequent transferring process. It should be noted that the target elements 130 in the embodiment are semiconductor elements such as micro-LEDs and micro-lasers. The "micro" here refers to the scale of 1-100 μm. But no limitation is given here in the embodiment of the present invention. Larger or smaller size scale may also be applicable according to specific conditions.

For example, the sacrifice layer 210 may be made from polycrystalline silicon (poly-Si), photoresist materials, polyimide, metal or various kinds of oxides, for example, may be made from phosphosilicate glass (PSG) or low-temperature oxide (LTO). The embodiment is not limited thereto.

As illustrated in FIG. 4B, the sacrifice layer 210 is etched so that projections of the etched sacrifice layer 210 on the original substrate 200 can completely fall within projections of the target element 130 on the original substrate 200; after the gripping leg moves to the gripping position subsequently, the projection of the gripping leg 112 on the original substrate 200 is disposed on the outside of the projection of the etched sacrifice layer 210 on the original substrate 200, namely the sacrifice layer 210 is etched so as to remove the sacrifice layer 210 between the plurality of target elements 130 and the sacrifice layer 210 between a bottom edge part of each target element 130 and the original substrate 200; and when the gripping leg 112 is in the gripping position, the gripping leg 112 is at least partially disposed between the bottom edge part of the target element 130 and the original substrate 200. The embodiment is not limited thereto.

For example, the etching of the sacrifice layer 210 may adopt wet etching, dry etching, etc. The dry etching technology is, for example, plasma etching technology, for example, reactive ion etching, electron cyclotron resonance (ECR), inductive coupling plasma reactive ion etching, or chemically assisted ion etching including reactive ion etching, and. No limitation is given here in the embodiment. It should be noted that the step of forming the sacrifice layer between the target elements and the original substrate is not a necessary step in the embodiment, only for better separating the target elements from the original substrate.

Figure 5:
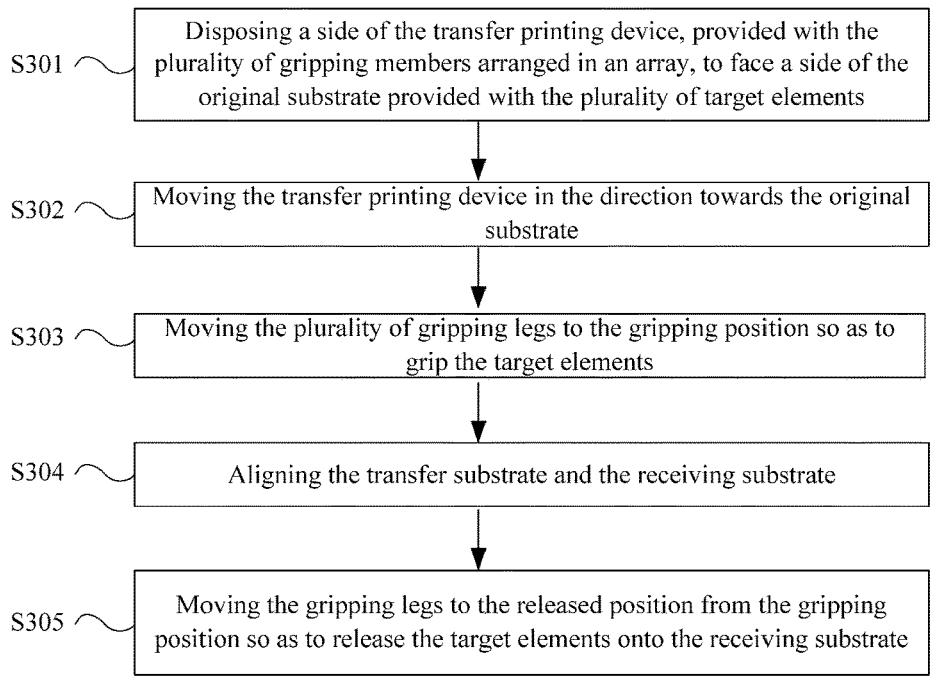
FIG. 5 is a schematic diagram of a transfer method provided by one embodiment of the present invention.

FIG. 5 is a schematic diagram of a transfer method provided by the embodiment. FIGS. 6A-6F are schematic diagrams illustrating the transfer printing processes of the transfer method as illustrated in FIG. 5 provided by one example of the embodiment. As illustrated in FIGS. 5 and 6, the specific transfer method comprises the following steps S301-S305.

S301: disposing a side of the transfer apparatus 10, provided with the plurality of gripping members 110 arranged in an array, to face a side of the original substrate 200 provided with the plurality of target elements 130.

Figure 6A:
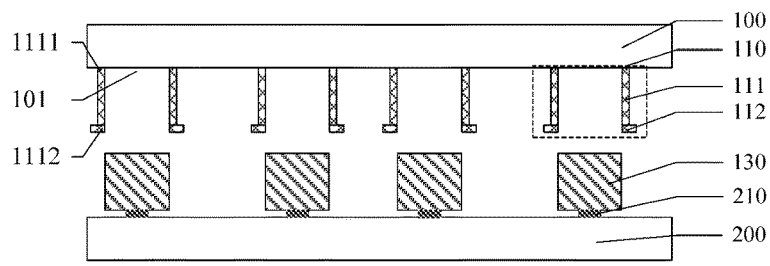
FIGS. 6A-6F are schematic diagrams illustrating the transfer printing processes of the transfer method as illustrated in FIG. 5.

As illustrated in FIG. 6A, projections of the plurality of target elements 130 on the transfer substrate 100 fall within projections of the plurality of gripping members 110 on the transfer substrate 100, namely the plurality of target elements 130 are in one-to-one correspondence with the plurality of gripping members 110. The embodiment is not limited thereto. For example, the number of the gripping members 110 may be greater than the number of the target elements 130.

For example, the original substrate 200 may be made from one material selected from the group consisted of silicon, silicon dioxide, glass, quartz, zinc oxide and other metal alloys. The embodiment is not limited thereto.

For example, the transfer apparatus includes a control system which is configured to apply a first control signal or a second control signal to each gripping member. The control system is not illustrated in the embodiment. For example, the applied control signals include control signals respectively applied to the gripping arms and the gripping leg, so that the gripping leg can move to the gripping position or the released position relative to the gripping arm. The embodiment is not limited thereto. For example, the applied control signal may be the first control signal or the second control signal applied to the gripping leg, so that the other end of the gripping leg can rotate to the gripping position or the released position in a plane parallel to the transfer substrate when one end of the gripping leg is connected with the second end of the gripping arm.

For example, the control system may simultaneously apply the control signals to all the gripping members, so as to realize the transferring of all the target elements; and the control system may also respectively apply the control signal to each gripping member, namely may selectively control partial gripping members, so as to realize the transfer printing of partial target elements.

As illustrated in FIG. 6A, the gripping leg 112 in the transfer apparatus 10 is in the released position, namely in the state applied with the second control signal. For example, the projection of the gripping leg 112 on the original substrate 200 is disposed on the outside of the projection of the target element 130 on the original substrate 200, and the projections of the gripping leg 112 on the original substrate 200 are disposed on both sides or at the periphery of the projection of the target element 130 on the original substrate 200. The embodiment is not limited thereto.

For example, the gripping arm 111 is extended along the direction away from the transfer substrate 100, and the gripping leg 112 is extended along the direction perpendicular to the griping arm 111. The "perpendicular" here includes "strictly perpendicular" and "roughly perpendicular". For example, the gripping arm 111 may be extended along the direction perpendicular to the transfer substrate 100 and may also be extended along the direction away from the transfer substrate 100, at a certain angle with the transfer substrate 100, which is not limited in the embodiment and may be set according to actual demands. For example, the length of the gripping arm 111 of each gripping member 110 is not less than the thickness of the target element to be gripped.

For example, the gripping leg 112 may be configured to move to the gripping position or the released position relative to the gripping arm 111 in a plane parallel to the transfer substrate 100 (namely the gripping leg 112 moves relative to the gripping arm 111 along the AB direction as illustrated in FIG. 1A). The embodiment is not limited thereto. For example, the gripping leg may also be configured to allow one end to be connected with the second end of the gripping arm and allow the other end to rotate to the gripping position or the released position in the plane parallel to the transfer substrate.

As illustrated in FIG. 6A, the transfer substrate 100 includes a plurality of gripping areas 101 arranged in an array; one gripping member 110 is disposed on each gripping area 101, namely the plurality of gripping areas 101 are in one-to-one correspondence with the plurality of gripping members 110; and the plurality of gripping areas 101 fall within projections of the plurality of gripping members 110 on the transfer substrate 100. A first end 1111 of a gripping arm 111 of each griping member 110 is disposed at the edge of each gripping area 101, so as to grip the target element. For example, each gripping member 110 adopts two gripping arms 111 to grip the target element (as illustrated in FIG. 1A); and the two gripping arms 111 are respectively disposed at two opposite edges of the gripping area 101. The space between the gripping arms 111 may accommodate the target element to be gripped, so as to ensure that the gripping member 110 can grip the target element to be gripped. Therefore, the gripping member has strong gripping ability on the target element and has small damage to the target element.

For example, the gripping arms 111 may be disposed at two opposite edges of each gripping area 101, and may also be disposed at four edges of each gripping area 101. No limitation is given here in the embodiment. For example, any edge of each gripping area 101 may be provided with one gripping arm 111 and may also be provided with a plurality of gripping arms 111, which is not limited in the embodiment. For example, when any edge of each gripping area 101 is provided with one gripping arm 111, a second end 1112 of each gripping arm 111 may be connected with one gripping leg 112 and may also be connected with a plurality of gripping leg 112, which is not limited in the embodiment.

S302: moving the transfer apparatus 100 to in the direction towards the original substrate 200.

Figure 6B:
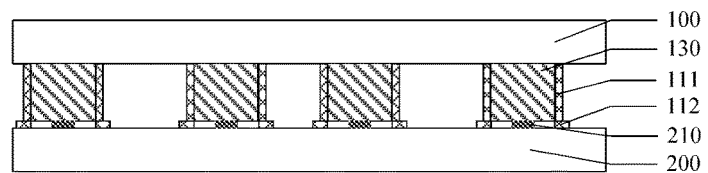

As illustrated in FIG. 6B, the transfer apparatus 10 moves in the direction towards the original substrate 200, so that the gripping arms 111 of the plurality of gripping members 110 can completely encircle the plurality of target elements 130.

It should be noted that description is given in the embodiment by taking the case that the sectional shape of a side surface of the target element 130 in FIG. 6B is rectangular as an example, and at this point, the gripping arms 111 are set to be extended along the direction perpendicular to the transfer substrate 100. The embodiment is not limited thereto. For example, when the sectional shape of the target element is trapezoidal or the like, the gripping arms are set to be extended along the direction away from the transfer substrate, and the space between the gripping arms can accommodate the target element to be gripped, so that the gripping member can grip the target element to be gripped.

S303: moving the gripping legs 112 to the gripping positions so as to grip the target elements 130.

Figure 6C:
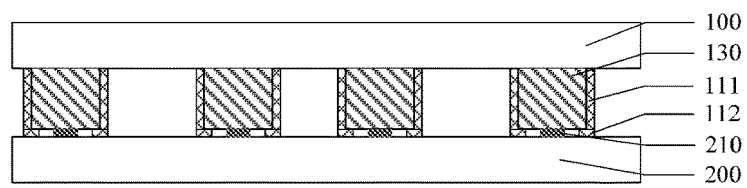

As illustrated in FIG. 6C, the first control signal is applied to the gripping member 110. For example, voltage with opposite polarities is respectively applied to the gripping arm 111 and the gripping leg 112, so that the gripping arm 111 and the gripping leg 112 can respectively carry charges with opposite polarities and hence produce electrostatic forces attracting each other. Thus, the gripping leg 112 of each gripping member 110 is driven to move towards the bottom side of the target element 130 (between the target element 130 and the original substrate 200) and move to positions at which the gripping leg 112 can grip the target element 130.

For example, after the control system applies the control signal to the gripping arm 111, the second end 1112 of the gripping arm 111 carries positive or negative charges; and after the control system applies the control signal to the gripping leg 112, one end of the gripping leg 112 away from the gripping arm 111 carries positive or negative charges when the gripping leg is in the released position. The embodiment is not limited thereto. One end of the gripping leg 112 close to the gripping arm 111, when the gripping leg is in the released position, may also carry positive or negative charges.

For example, after the gripping leg 112 of the gripping member 110 grip the target element 130, the transfer apparatus moves towards the direction away from the original substrate 200, so as to take away the plurality of target elements 130 from the original substrate 200; and subsequently, the transfer apparatus moves towards the receiving substrate.

S304: aligning the transfer substrate 100 and the receiving substrate 240.

For example, the receiving substrate 240 may be made from one or a plurality of materials selected from glass, polyimide, polycarbonate, polyacrylate, polyetherimide, polyether sulfone, polyethylene terephthalate (PET) and polyethylene naphthalate (PEN). No limitation is given here in the embodiment. For example, the receiving substrate 240 may be a display substrate, an illuminating substrate, a substrate provided with functional elements (e.g., transistors or ICs), a substrate provided with metal redistribution wires, etc. The embodiment is not limited thereto.

For example, the transfer substrate 100 may be aligned with a plurality of alignment marks of the receiving substrate 240 via a plurality of alignment holes. By adoption of the alignment holes and the alignment marks, an alignment system may be adopted for aligning the transfer substrate 100 and the receiving substrate 240. The alignment marks and the alignment holes are not illustrated in the embodiment. No limitation is given here in the embodiment. Other alignment means may also be adopted for alignment.

Figure 6D:
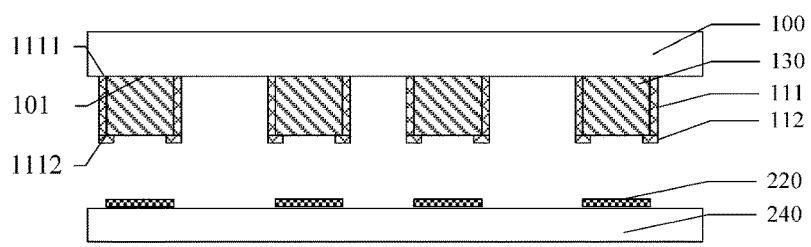

As illustrated in FIG. 6D, projections of the plurality of gripping areas 101 on the transfer substrate 100 on the receiving substrate 240 fall within projections of a plurality of bonding layers 220 on the receiving substrate 240, namely the plurality of gripping members 110 are in one-to-one correspondence with the plurality of bonding layers 220.

S305: moving the gripping leg 112 to the released positions from the gripping positions so as to release the target elements 130 onto the receiving substrate 240.

Figure 6E:
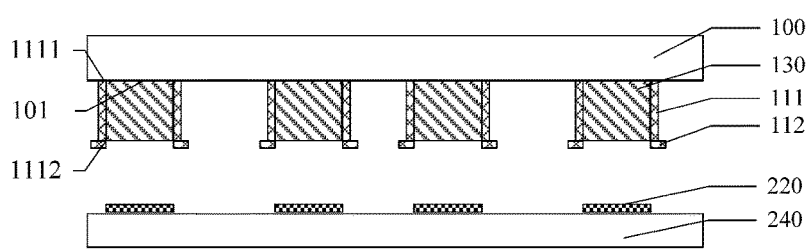

As illustrated in FIG. 6E, after the gripping leg 112 move to the released position, the projections of the gripping leg 112 of each gripping member 110 on the transfer substrate 100 are disposed on the outside of the gripping area 101 corresponding to the gripping member 110. For example, the gripping member 110 responds to the applied second control signal, voltage with the same polarity is respectively applied to the gripping arm 111 and the gripping leg 112, so that the gripping arm 111 and the gripping leg 112 can respectively carry charges with the same polarity, so as to produce electrostatic forces repelling each other. Due to the produced electrostatic force, the gripping leg 112 of each gripping member 110 move in the direction away from the target element 130 until the gripping leg are in the released position. That is to say, before the target element 130 is released, the gripping leg 112 move in the direction away from the target element 130, and release the target element 130 onto the receiving substrate 240 until the projections of the gripping leg 112 on the transfer substrate 100 are disposed on the outside of the projection of the target element 130 on the transfer substrate 100. Thus, the transfer printing process is completed.

For example, in order to better grip the target element, the size of the target element shall be matched with the size of the gripping area. For example, in the gripping state, the projection of the target element on the transfer substrate may be roughly superimposed with the gripping area, or slightly smaller than the gripping area.

For example, in the process of releasing the target element 130, the target element 130 may be released down in virtue of gravity action, and may also be released due to the pressure applied by the gripping member 110. No limitation is given here in the embodiment.

Figure 6F:
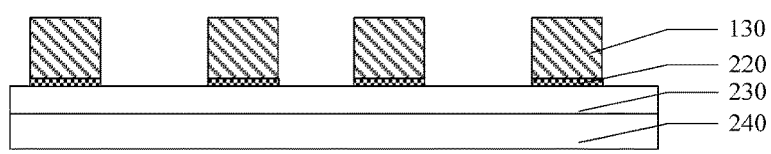

As illustrated in FIG. 6F, after the gripping leg 112 in the transfer apparatus move to the released position, the target element 130 is released onto the bonding layer 220 on the receiving substrate 240, and pressed and fixed on the bonding layer 220. For example, the gripping member 110 may be utilized to press and fix the target element 130 on the bonding layer 220. No limitation is given here in the embodiment. The target element 130 may also be pressed and fixed on the bonding layer by other means.

For example, the bonding layer 220 may be taken as an adhesive layer and configured to fix the target element 130. For example, the bonding layer 220 may be made from materials having a liquidus temperature or a melting temperature of 300° C. or less, or more specifically 200° C. or less, namely materials capable of bonding the target element 130 onto the receiving substrate 240. For example, the bonding layer 220 may be heated at a temperature higher than the liquidus temperature or the melting temperature, so the bonding layer 220 can change the surface tension due to phase change, and hence the target element 130 can be easily fixed. No limitation is given here in the embodiment. For example, the bonding layer 220 may be made from indium, tin, low-melting welding flux materials containing indium and tin materials, or thermoplastic polymers including materials such as polyethylene, polypropylene and polyester. The embodiment is not limited thereto. For example, the bonding layer 220 with uniform thickness may be formed by proper method according to specific composition in the bonding layer 220. For example, the bonding layer 220 with uniform thickness may be formed by methods such as sputtering or electron beam volatilization and deposition. No limitation is given here in the embodiment.

For example, a driver circuit 230 is disposed on the receiving substrate 240. For example, the driver circuit 230 includes thin-film transistors (TFTs), etc. For example, the driver circuit 230 may adopt simple 2T1C driver circuit design and may also adopt 4T2C, 6T2C, 7T1C or the like with compensation function. No limitation is given to the selected driver circuit in the embodiment.

It should be noted that the above concrete steps are only some illustrative steps in the present invention. For example, the transfer method adopts the transfer apparatus provided by the first embodiment. The embodiment is not limited thereto. The transfer apparatus provided by the second embodiment may also be adopted. In this case, the control signals applied by the control system must be changed correspondingly. No further description will be given here.

In some examples, the transferring apparatus further includes a control module. The control module is configured to supply the first control signal and the second control signal to the gripping member. In the embodiments of the present invention, the control module may be achieved by software so as to be executed by various types of processors. For example, a marked executable code module may include one or more physical or logical blocks of a computer instruction, and for example, may be constructed as an object, a procedure or a function. Even so, executable codes of the marked module are not required to be physically located together but may include different instructions stored on different physical blocks. When the instructions are logically combined, a module is constructed and the predetermined object of the module is achieved.

Actually, the executable code module may include a single instruction or many instructions which may even be distributed on a plurality of different code segments, distributed in different programs, and distributed on a plurality of storage devices. Similarly, operational data may be identified in the module, achieved by any appropriate means and organized in any appropriate type of data structure. The operational data may be collected as a single data set or may be distributed at different positions (including the case of being distributed on different storage devices) and may at least partially exist on a system or a network by being only taken as electronic signals.

When the module can be achieved by software, in view of the level of the traditional hardware technology, those skilled in the art can establish corresponding hardware circuits on modules capable of being achieved by software to achieve corresponding functions regardless of the cost. The hardware circuits include conventional very large scale integration (VLSI) circuits or gate arrays and conventional semiconductors such as logic chips and transistors or other discrete elements. The module may also be achieved by programmable hardware units such as field programmable gate arrays, programmable logic arrays and programmable logical devices.

The following points should be noted:

(1) Unless otherwise specified, the same reference numeral in the embodiments of the present invention and the accompanying drawings represents the same meaning.

(2) The accompanying drawings in the embodiments of the present invention only involve structures relevant to the embodiments of the present invention, and other structures may refer to the prior art.

(3) For clarity, in the accompanying drawings of the embodiments of the present invention, the thickness of layers or regions is enlarged. It should be understood that: when an element such as a layer, a film, a region or a substrate is referred to as being disposed "on" or "beneath" another element, the element may be "directly" disposed "on" or "beneath" another element, or an intermediate element may be provided.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The invention claimed is:

1. A transfer apparatus, comprising:
   a transfer substrate; and
   a plurality of gripping members arranged in an array and disposed on the transfer substrate,
   wherein each gripping member includes:
      at least two gripping arms each of which has a first end disposed on the transfer substrate, and the first end is relatively fixed with the transfer substrate; and
      gripping legs, connected with second ends of the gripping arms and configured to switch between a gripping position and a released position,
   wherein the gripping legs are movable relative to the gripping arms so as to switch between the gripping position and the released position.

2. The transfer apparatus according to claim 1, wherein the gripping arms are extended in a direction away from the transfer substrate; and the gripping legs are extended in a direction perpendicular to the gripping arms.

3. The transfer apparatus according to claim 1, wherein the transfer substrate includes a plurality of gripping areas arranged in an array; the first ends of the gripping arms of each gripping member are disposed at an edge of each gripping area; and the at least two gripping arms are respectively disposed at two opposite edges of the gripping area.

4. The transfer apparatus according to claim 3, wherein the gripping legs are configured to move to the gripping position in response to a first control signal applied to the gripping member, and move to the released position from the gripping position in response to a second control signal applied to the gripping member.

5. The transfer apparatus according to claim 4, wherein after the griping legs move to the gripping position, a projection of the gripping legs of each gripping member on the transfer substrate is at least partially disposed in the gripping area corresponding to the gripping member; and
   after the gripping legs move to the released position, the projection of the gripping legs of each gripping member on the transfer substrate is disposed on the outside of the gripping area corresponding to the gripping member.

6. The transfer apparatus according to claim 1, wherein the gripping member further includes: a base,
   wherein the base is disposed on the transfer substrate, and the first ends of the gripping arms are disposed at the edge of the base.

7. The transfer apparatus according to claim 1, wherein each gripping area has a maximum size of 1 to 100 µm.

8. A transfer method for employing a transfer apparatus, wherein the transfer apparatus comprises:
   a transfer substrate; and
   a plurality of gripping members arranged in an array and disposed on the transfer substrate,
   wherein each gripping member includes:
      at least two gripping arms each of which has a first end disposed on the transfer substrate, and the first end is relatively fixed with the transfer substrate; and
      gripping legs, connected with second ends of the gripping arms and configured to switch between a gripping position and a released position, the transfer method for employing the transfer apparatus, comprising:
   disposing a side of the transfer apparatus, provided with the plurality of gripping members arranged in an array, to face a side of an original substrate provided with a plurality of target elements, so that projections of the plurality of target elements on the transfer substrate fall within projections of the plurality of gripping members on the transfer substrate;
   moving the transfer apparatus in a direction towards the original substrate;
   moving the gripping legs to the gripping position so as to grip the target elements, the gripping position comprises a side of the target elements away from the transfer substrate;
   aligning the transfer substrate and a receiving substrate;
   moving the gripping legs to the released position from the gripping position, so as to release the target elements onto the receiving substrate; and
   forming a sacrifice layer between the original substrate and the plurality of target elements, and etching the sacrifice layer to remove the sacrifice layer disposed between the plurality of target elements and the sacrifice layer disposed between a bottom edge part of each target element and the original substrate, wherein upon the gripping legs being disposed at the gripping position, the gripping legs at least partially disposed between the bottom edge part of the target elements and the original substrate.

9. The transfer method according to claim 8, wherein the gripping arms are extended in a direction away from the transfer substrate; and the gripping legs are extended in a direction perpendicular to the gripping arms.

10. The transfer method according to claim 8, wherein the transfer substrate includes a plurality of gripping areas arranged in an array; the first ends of the gripping arms of each gripping member are disposed at an edge of each gripping area; and the at least two gripping arms are respectively disposed at two opposite edges of the gripping area.

11. The transfer method according to claim 10, wherein the gripping legs move to the gripping position in response to a first control signal applied to the gripping member, and move to the released position from the gripping position in response to a second control signal applied to the gripping member.

12. The transfer method according to claim 11, wherein after the gripping legs move to the gripping position, a projection of the gripping legs of each gripping member on the transfer substrate is at least disposed in the gripping area corresponding to the gripping member, and the gripping legs are at least partially disposed at the bottom side of the target elements; and
   after the gripping legs move to the released position, the projection of the gripping legs of each gripping member on the transfer substrate is disposed on the outside of the gripping area corresponding to the gripping member.

13. The transfer method according to claim 8, further comprising: moving the transfer apparatus in a direction away from the original substrate after the gripping legs grip the target elements.

14. The transfer method according to claim 8, further comprising: releasing the target elements to bonding layers on the receiving substrate, and pressing and fixing the target elements on the bonding layers.

15. A transfer apparatus, comprising:
   a transfer substrate; and
   a plurality of gripping members arranged in an array and disposed on the transfer substrate,
   wherein each gripping member includes:
      at least two gripping arms each of which has a first end disposed on the transfer substrate, and the first end is relatively fixed with the transfer substrate; and
      gripping legs, connected with second ends of the gripping arms and configured to switch between a gripping position and a released position,
   wherein the transfer substrate includes a plurality of gripping areas arranged in an array, the first ends of the gripping arms of each gripping member are disposed at an edge of each gripping area, and the at least two gripping arms are respectively disposed at two opposite edges of the gripping area,
   wherein the gripping leas are configured to: move to the gripping position in response to a first control signal applied to the gripping member; and move to the released position from the gripping position in response to a second control signal applied to the gripping member, and
   wherein the gripping arms are configured to: be in a flat state in response to the first control signal applied to the gripping member; and be in a warping state in response to the second control signal applied to the gripping member.

16. The transfer apparatus according to claim 15, wherein after the griping legs move to the gripping position, a projection of the gripping legs of each gripping member on the transfer substrate is at least partially disposed in the gripping area corresponding to the gripping member, and
   after the gripping legs move to the released position, the projection of the gripping legs of each gripping member on the transfer substrate is disposed on the outside of the gripping area corresponding to the gripping member.

17. The transfer apparatus according to claim 15, wherein the gripping member further includes a base,
   wherein the base is disposed on the transfer substrate, and the first ends of the gripping arms are disposed at the edge of the base.

* * * * *